(12) United States Patent
Cui et al.

(10) Patent No.: US 7,350,183 B2
(45) Date of Patent: Mar. 25, 2008

(54) METHOD FOR IMPROVING OPTICAL PROXIMITY CORRECTION

(75) Inventors: Yuping Cui, Fishkill, NY (US); Scott M. Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 10/904,355

(22) Filed: Nov. 5, 2004

(65) Prior Publication Data

US 2006/0101370 A1    May 11, 2006

(51) Int. Cl.
G06F 17/50     (2006.01)
G03F 1/00      (2006.01)

(52) U.S. Cl. ............... 716/21; 716/4; 716/19; 716/20; 430/5

(58) Field of Classification Search ............ 716/2, 716/4, 8, 19, 20, 21; 705/1; 430/5
See application file for complete search history.

(56) References Cited

U.S. PATENT DOCUMENTS

| | | | |
|---|---|---|---|
| 6,289,499 B1 * | 9/2001 | Rieger et al. ............ 716/21 |
| 6,899,982 B2 * | 5/2005 | McArthur et al. ....... 430/22 |
| 7,120,895 B2 * | 10/2006 | Ye et al. .................. 716/21 |
| 7,131,101 B2 * | 10/2006 | Pierrat et al. ............ 716/19 |
| 7,137,092 B2 * | 11/2006 | Maeda ..................... 716/8 |
| 7,138,212 B2 * | 11/2006 | Hsu et al. ................ 430/5 |
| 7,155,689 B2 * | 12/2006 | Pierrat et al. ............ 716/4 |
| 7,174,520 B2 * | 2/2007 | White et al. ............. 716/4 |
| 7,197,722 B2 * | 3/2007 | Wong et al. ............. 716/2 |
| 2003/0229881 A1 * | 12/2003 | White et al. ........... 716/19 |
| 2005/0076322 A1 * | 4/2005 | Ye et al. ................. 716/20 |
| 2005/0089768 A1 * | 4/2005 | Tanaka et al. ........... 430/5 |
| 2005/0132306 A1 * | 6/2005 | Smith et al. ............ 716/1 |
| 2005/0149902 A1 * | 7/2005 | Shi et al. ................ 716/21 |
| 2005/0257178 A1 * | 11/2005 | Daems et al. ............ 716/2 |
| 2005/0273753 A1 * | 12/2005 | Sezginer ................. 716/21 |
| 2006/0085772 A1 * | 4/2006 | Zhang .................... 716/4 |
| 2006/0143590 A1 * | 6/2006 | Beale ..................... 716/19 |
| 2006/0161452 A1 * | 7/2006 | Hess ...................... 705/1 |
| 2006/0190850 A1 * | 8/2006 | Kohle et al. ............. 716/2 |
| 2006/0236294 A1 * | 10/2006 | Saidin et al. ........... 716/19 |
| 2006/0266243 A1 * | 11/2006 | Percin et al. ............ 101/484 |
| 2007/0009808 A1 * | 1/2007 | Abrams et al. .......... 430/5 |
| 2007/0061772 A1 * | 3/2007 | Ye et al. ................. 716/21 |

* cited by examiner

*Primary Examiner*—Stacy A Whitmore
*Assistant Examiner*—Helen Rossoshek
(74) *Attorney, Agent, or Firm*—Todd M. C. Li

(57) ABSTRACT

A method for performing model based optical proximity correction (MBOPC) and a system for performing MBOPC is described, wherein the process model is decomposed into a constant process model term and a pattern dependent portion. The desired wafer target is modified by the constant process model term to form a simulation target that is used as the new target within the MBOPC process. The pattern dependent portion of the model is used as the process model in the MBOPC algorithm. This results final mask designs that result in improved across-chip line width variations, and a more robust MBOPC process.

31 Claims, 16 Drawing Sheets

METHOD FOR IMPROVING OPTICAL PROXIMITY CORRECTION

BACKGROUND OF INVENTION

The present invention relates in general to semiconductor integrated circuit (IC) process technology, particularly, photolithography used in fabrication of semiconductor ICs, and more particularly to optical proximity correction.

The advent of advanced lithographic techniques and the attempt of chip manufacturers to closely follow Moore's law predicting an exponential growth of number of components on a chip and their shrinkage on the wafer is making the process of designing tools for automating the chip design extremely challenging. The chip is imprinted by means of optical lithographic techniques on the silicon wafer by way of chrome on glassmasks. As the components on the chip become smaller, they are now in the verge of reaching the limits of capacity of the lithographic process.

One of the most common problem of printing integrated circuits on silicon wafers from the mask using lithographic processing is the loss of fidelity of the mask shapes. The dimensions of the wafer shapes are usually much smaller than the wavelength of light that is used in the lithographic processing. The non-linearities associated with this lithographic process of imprinting and the laws of physics associated with light (including diffraction of light waves) makes impressing highly unpredictable. Referring to FIGS. 1A-1B, for example, rectangles 101 on a mask, illustrated in FIG. 1A, are foreshortened into elliptical 102 on the resist, right angles are rounded, and the width of the shapes shrinks, as illustrated in FIG. 1B. In addition to the non-linearity associated with the optical effects, the process of developing after exposing the wafer and the photoactive material (i.e. photoresist, equivalently referred to as resist) thereon also adds to the uncertainty associated with the critical dimensions of the features. Other effects mainly related to the exposure and development effect associated with the resist exist that contribute to the distortions. The wafer shapes get deformed due the diffraction and scattering of light and other related optical and chemical effects of photo-resist materials. The combination of these lithographic processing effects are known as optical proximity effects.

To counter the problem of optical proximity, and increase the fidelity of the wafer printing, mask designers take into account the deformities introduced by the aforementioned lithographic processing effects by intentionally and systematically distorting the original shapes on the mask. The net result of these distortions is that the imprinted shape on the wafer ultimately looks like the target or intended images, satisfying the design rules that were created to achieve the desired yield in chip manufacturing. These methods are generally referred to as optical proximity corrections (OPC). OPC may be performed by simulating the imaging and on-wafer processes, such as etch processes, comparing the simulated image to the target image, and adjusting the mask design so that the simulated image will more closely resemble the target image. This method, also known as model-based OPC (MBOPC), emulates the physical and optical effects that are mostly responsible for shape deformations. At the heart of these methods is a computer simulation program that, given the appropriate optical and physical parameters and the original dimension of the object on the mask, predicts, with a certain degree of accuracy, the printed dimension of the object on the wafer. In the correction phase of the model-based optical proximity correction (MBOPC), the shape on the mask is iteratively modified so that the resulting output closely approximates, within an acceptance criterion, what is desired for the image or imprinted shape on the wafer. This method automatically deforms existing mask shapes to achieve the target dimensions on the wafer.

As target feature size continues to shrink, resolution enhancement techniques (RET) such as alternating phase shift mask (altPSM) or sub-resolution assist features (SRAFs) may be used to print the desired critical dimensions (CD) and provide sufficient lithographic process latitude. RET processes may require heavy overexposure and large etch trim, which can pose a significant challenge to the OPC algorithm, since large discrepancies exist between mask size and actual on-wafer target size. For example, given an initial designed target CD on the mask, the final wafer polysilicon dimension may be shrunk by about 50%. Since the OPC algorithm corrects the mask shapes based on simulated target shapes, the fixed corrections applied to the mask shapes may result in over-correction or under-correction which may converge to a solution only with difficulty, or may not converge at all. In addition, even if a solution is found, there may be large across-chip line width variation (ACLV), and in particular, problems in controlling the gate and polysilicon line widths.

The success of model-based OPC depends on a very accurate simulator that would predict the lithographic processing effects. The simulation of the image at points on the mask is computationally very expensive, and is typically limited to selected points. The simulator predicts the lithographic effect corresponding to selected points on the mask. A conventional OPC algorithm compares the simulation to the target at the selected points, and if the difference exceeds a predefined threshold, the mask shape will be modified, typically by modifying the edge segments on the mask by a fixed amount. This process can be better understood by reference to FIGS. 2A-2F.

For example, FIG. 2A illustrates a prior art target shape 307 that corresponds to the desired shape and size of the final pattern on the wafer. The corresponding mask shape 700 initially is set equal to the target shape. In this example, the target shape 307 is assumed to be a dark feature within the boundary of the shape 307. In the expanded view 201 of a portion of the target and mask shape, the segmentation of the mask shape 700 is shown. A first segment F1 is defined by points 211 and 212, and is connected to a second segment F2 defined by points 212 and 213. The OPC software will typically segment the mask shape 700 and allow each segment to be moved independently in order to create the final corrected mask shape. To determine how to move each segment, the lithography process is simulated along a single cut across the segment. These cuts are called the simulation sites. Here, cut A-A' is the simulation site across the first segment F1 which intersects the segment at point 215. Cut line B-B' is the simulation site along second segment F2, intersecting the segment F2 at point 225. By only simulating along a single simulation site per segment, the OPC software is able to simulate the lithography behavior across an entire chip in a reasonable amount of time.

Referring to FIG. 2B, a first step in creating the corrected mask shape is to determine the initial error where the edge of each segment will be printed (based on a simulation) compared to where it is desired to be printed (based on the target layer 307). Initially, the mask shape 700 is assumed to be equivalent to the desired target layer shape 307 and the edge placement error is computed along the simulation sites. The simulated image intensity along the simulation site A-A' is illustrated in the plot 251, and the plot 252 illustrates the intensity along simulation site B-B'. The printed edge of the feature is the location where the image intensity crosses a threshold intensity 50. The location along line A-A' where the intensity crosses the threshold 50 is indicated as 216, and similarly, the location where the intensity crosses the threshold 50 is indicated as 226. Initially, the printed edge 216, 226 for both simulation sites fall far inside the target edge 215, 225, respectively, for those sites. This indicates that the mask shape 700 for both segments F1, F2 needs to be moved outward, or to the right for segment F1 and up for segment F2. Since the printed edges 216, 226 fall a large distance from the target edge 215, 225, respectively, the mask edge segments F1, F2 are moved a large distance to try to compensate.

The next step in creating the corrected mask shape is to move the mask edge segments according to the computed errors and then resimulate the edge placements at the simulation sites. Referring to FIG. 2C, the mask edge segment F2 has moved outward past the location of simulation site A-A'. The resimulated image intensity along site A-A' is illustrated in the plot 251' and along site B-B' in the plot 252'. It can be seen that the computed edge 216' for segment F1 now appears to move far beyond the edge target location 215. This signifies to the OPC algorithm that segment F1 needs to be moved inward or to the left. On the other hand, the edge 226' for segment F2 is found to be converging on the target edge 225.

FIG. 2D illustrates the mask edges 700" after the next iteration of moving segments F1 and F2. A notch 705 is beginning to appear at segment F1. The intensities at the simulation sites A-A' (plot 251") and B-B' (plot 252") are then resimulated and the edge placement errors computed. The edge 226" for segment F2 has now fully converged on the target edge 225 along simulation site B-B'. However, the placement of the mask edge along the segment F2 remains beyond simulation site A-A' which is encompassed within the mask shape 700". Because of that, the printed edge 216" along simulation site A-A' is still beyond the target edge 215. This indicates to the OPC algorithm that the mask edge for segment F1 still needs to be moved further to the left.

Thus, the OPC algorithm will move the segment F1 again, as illustrated in FIG. 2E. Again the mask edge 700''' is moved and now a deep notch 705' is visible at segment F1. Segment F2 has not moved, as its edge 226''' has converged to the target edge 225 along simulation site B-B' as illustrated in plot 252'''. After simulation, the computed edge placement errors according to the OPC algorithm continue to indicate that, despite the large notch 705' created at segment F1, the printed edge 216''' is still far beyond the target edge 215. This is a consequence of the mask edge segment F2 being placed beyond simulation site A-A'.

This iterative process will continue without any real progress in reducing the edge placement error at site A-A'. At some point, the OPC software will give up trying to fix this point and will leave the large notch 705" in place, as in FIG. 2F. The main problem with this solution is that the large notch 705" at segment F1 can cause a very narrow feature to be printed. By comparing the simulated contour along a cut C-C' (that was not used for the OPC correction) to the simulated contour along the site A-A' that was used for the OPC correction, it is apparent that the printed edge 216''' may fall deep inside the target edge 215, causing a risk of failure. A simulated contour 250 shows the ringing that can occur close to the notch.

The root cause of these errors lies in the large separation D in mask edge 700''' from target edge 307. This separation D causes some simulation sites to be overrun by the mask edge, resulting in the simulation site not accurately predicting the behavior along the segment.

There is, therefore, a need for a method that can improve the robustness of the OPC correction algorithm, that can improve the OPC algorithm for RET methods such as over exposure and etch trim, and to provide improvements to lithography process robustness and improve ACLV.

SUMMARY OF INVENTION

It is therefore an objective of the present invention to provide a method and system for designing masks, for example, by performing model-based optical proximity correction (MBOPC), that improves across-chip line-width variations.

It is a further objective of the present invention to provide an MBOPC method and system that is compatible with existing MBOPC software.

It is yet a further objective of the present invention to provide an MBOPC method and system that is robust and will converge to a final mask design that minimizes defects.

It is still a further objective of the present invention to provide an mask design method, such as MBOPC method and system, that can incorporate multiple processes.

Accordingly, the present invention is directed to a method of designing a mask for forming a pattern on a wafer, the method including the steps of providing a process model describing a process for forming a pattern on a wafer, wherein the process includes the use of a mask; decomposing the process model into a pattern dependent model process and a constant term; providing a desired wafer target pattern; biasing the desired wafer target pattern with the constant term to form a simulation target pattern; providing an initial mask design; and modifying the initial mask design to form a final mask design, so that when the final mask is used as the mask in the pattern dependent model process, a simulated wafer pattern is obtained that matches the simulation target pattern within an acceptance criterion.

Stated another way, the invention provides for modifying the target design used in the MBOPC algorithm by a constant bias from the decomposed process model, and the modified target design is then the target that the MBOPC uses to determine when the sufficiency of mask correction is achieved. However, the invention provides that the simulation is performed using the decomposed pattern dependent portion of the process model.

The inventive mask design process is applicable to multiple process models including a lithographic image model, a resist model, an etch model or a combination thereof. In the case where the process includes a plurality of subprocesses, a model may be provided for each subprocess, and each subprocess model is individually decomposed into a pattern dependent process model and a constant term. The bias applied to the target design includes the constant terms from each of the decomposed subprocess models, and the simulation is performed using the decomposed pattern dependent models, according to the sequence of the subprocesses.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF DRAWINGS

For a more complete understanding of the present invention, and the advantages thereof, reference is now made to the following descriptions taken in conjunction with the accompanying drawings, which are not necessarily drawn to scale.

DETAILED DESCRIPTION

Figure 1B:
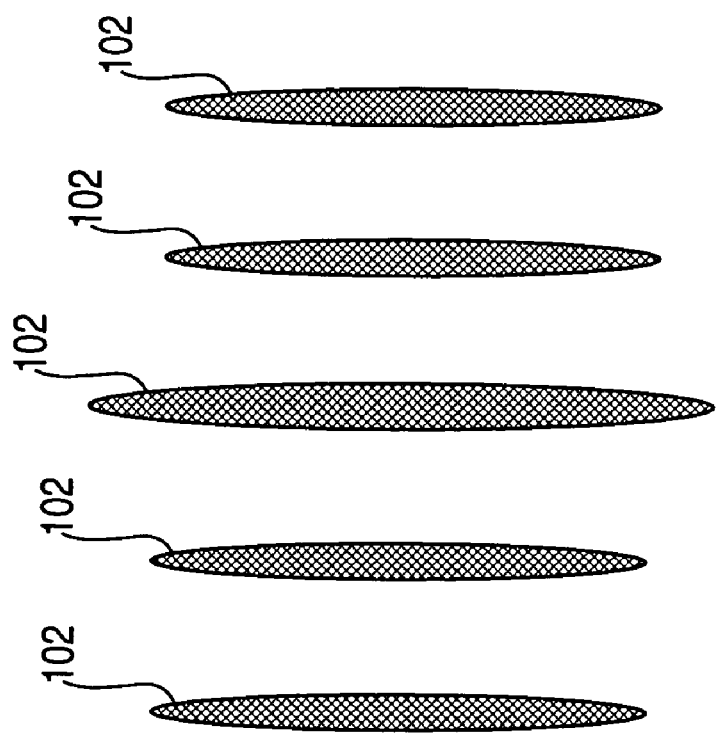
FIG. 1A-1B illustrates a pattern on a mask (1A) and the corresponding pattern of the wafer resist image (1B) as simulated an optical and resist model used in OPC.
Figure 1A:
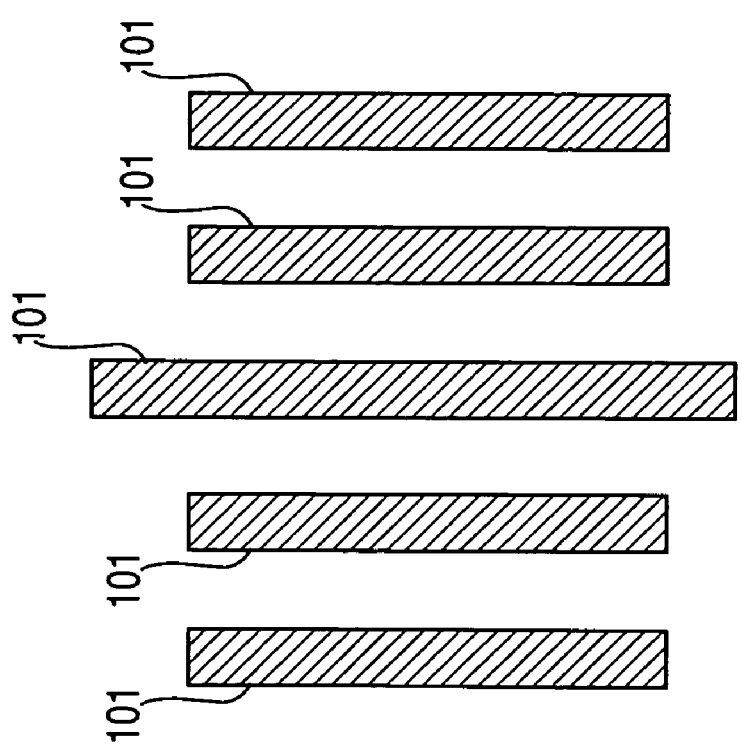
Figure 2A:
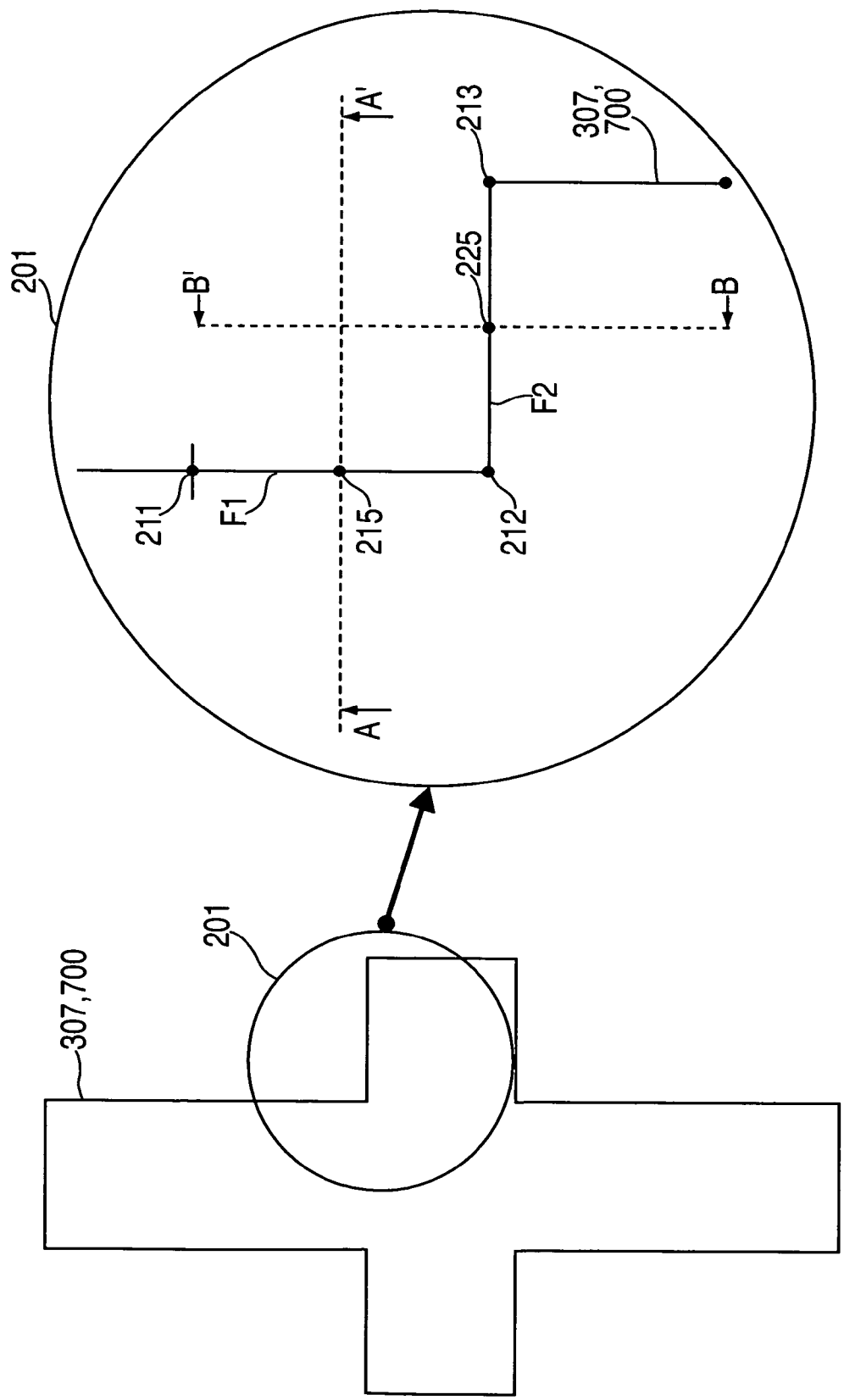
FIGS. 2A-2F illustrate steps of a conventional OPC procedure wherein corrections to the mask are made by adjusting segment positions.
Figure 2B:
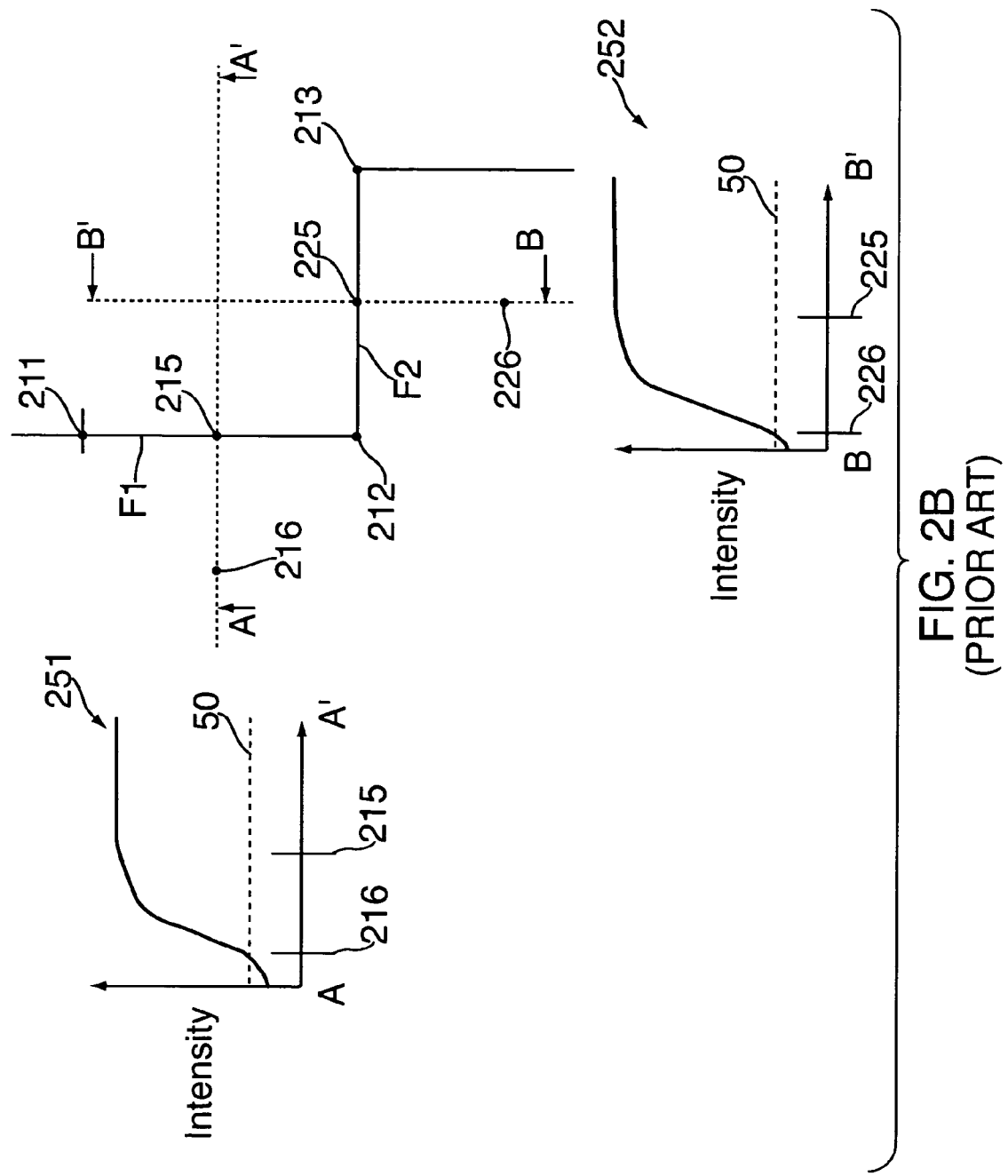
Figure 2C:
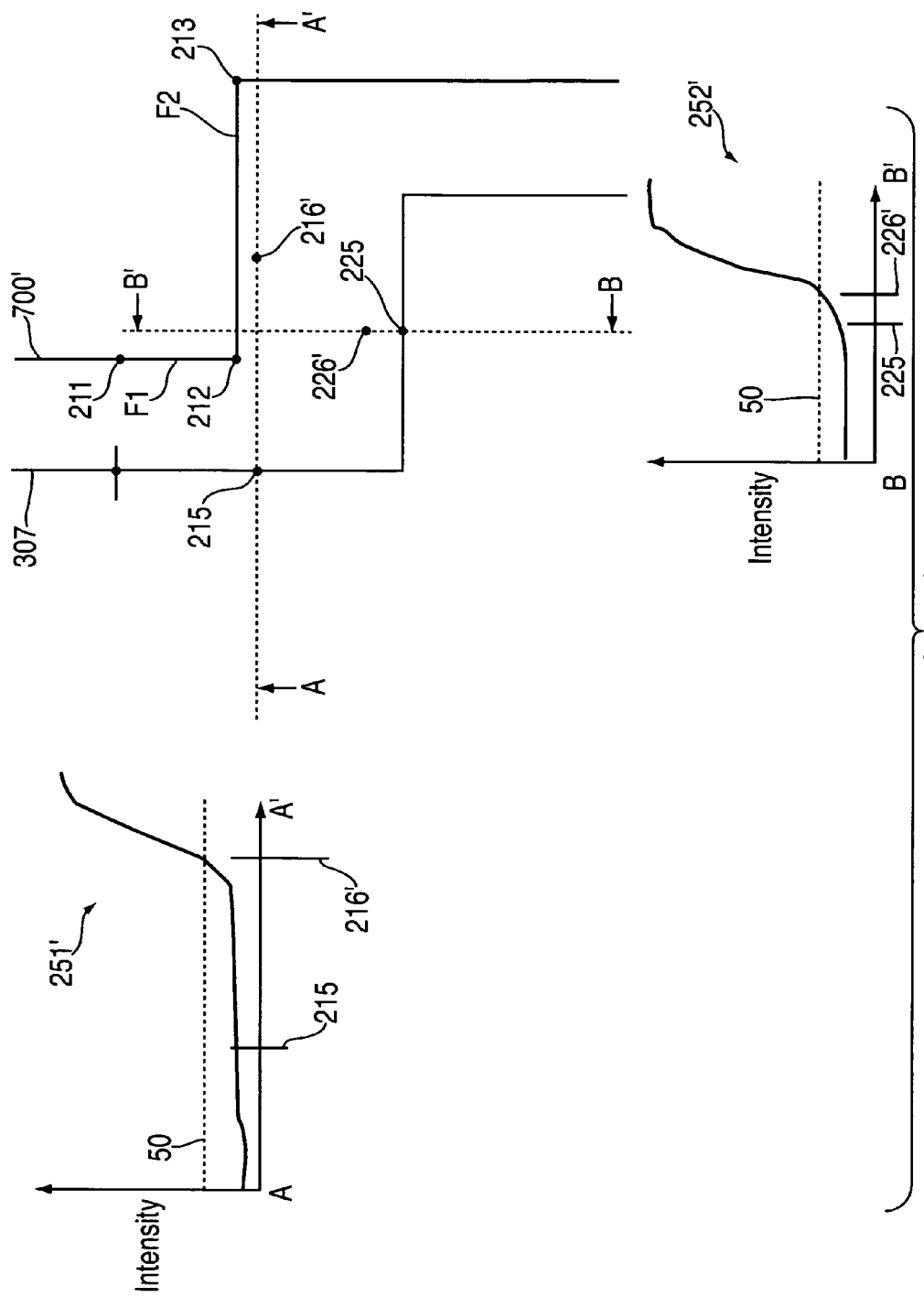
Figure 2D:
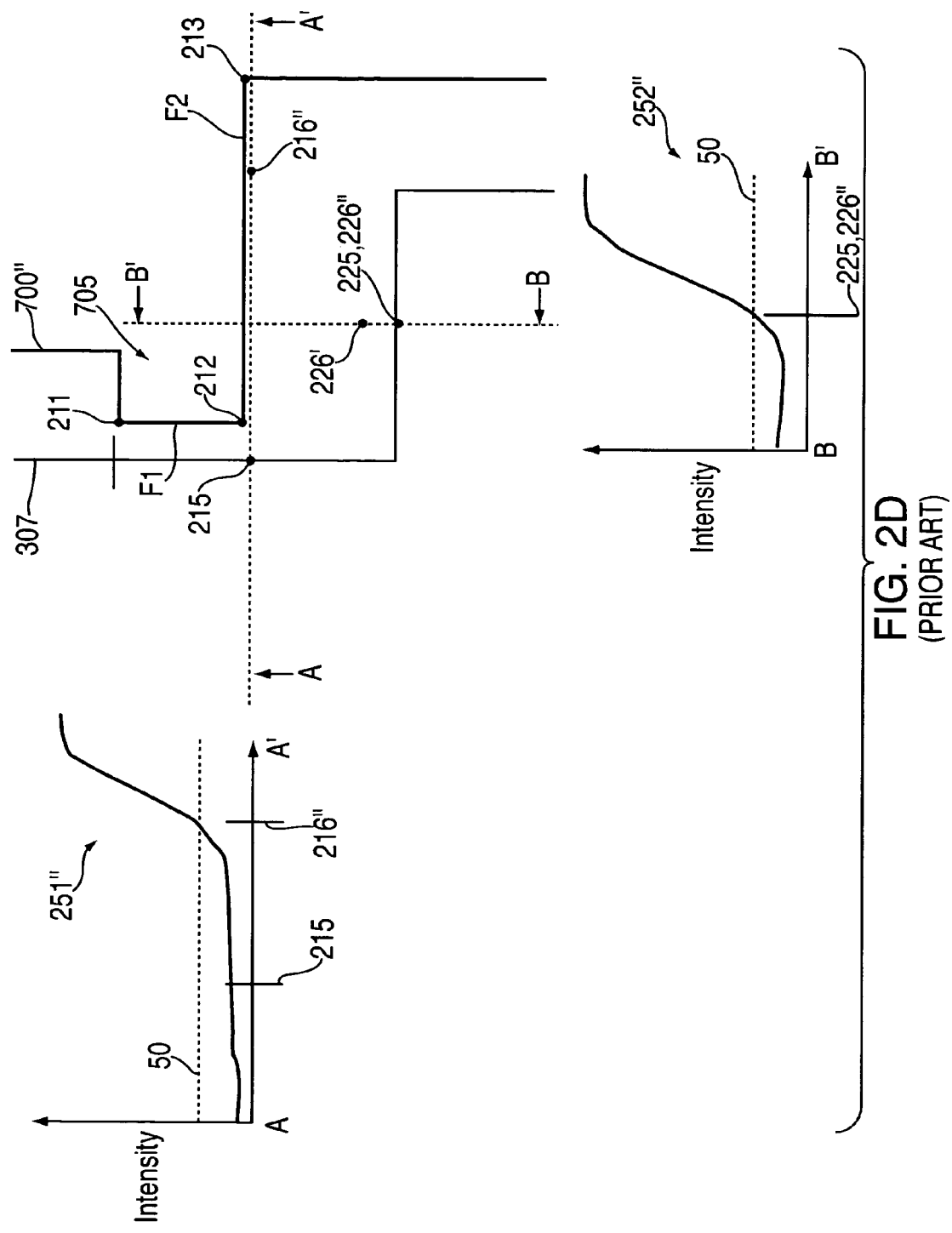
Figure 2E:
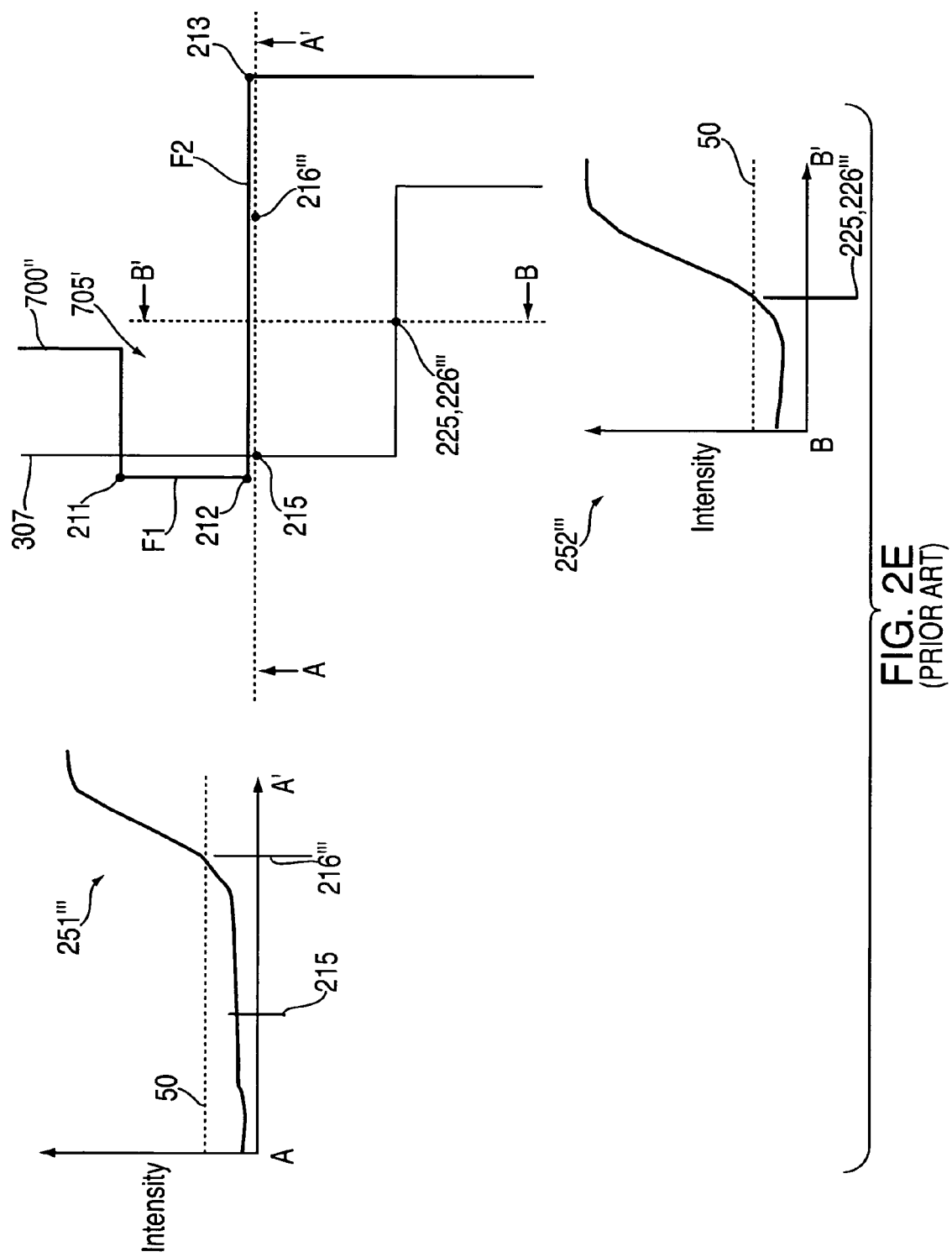
Figure 2F:
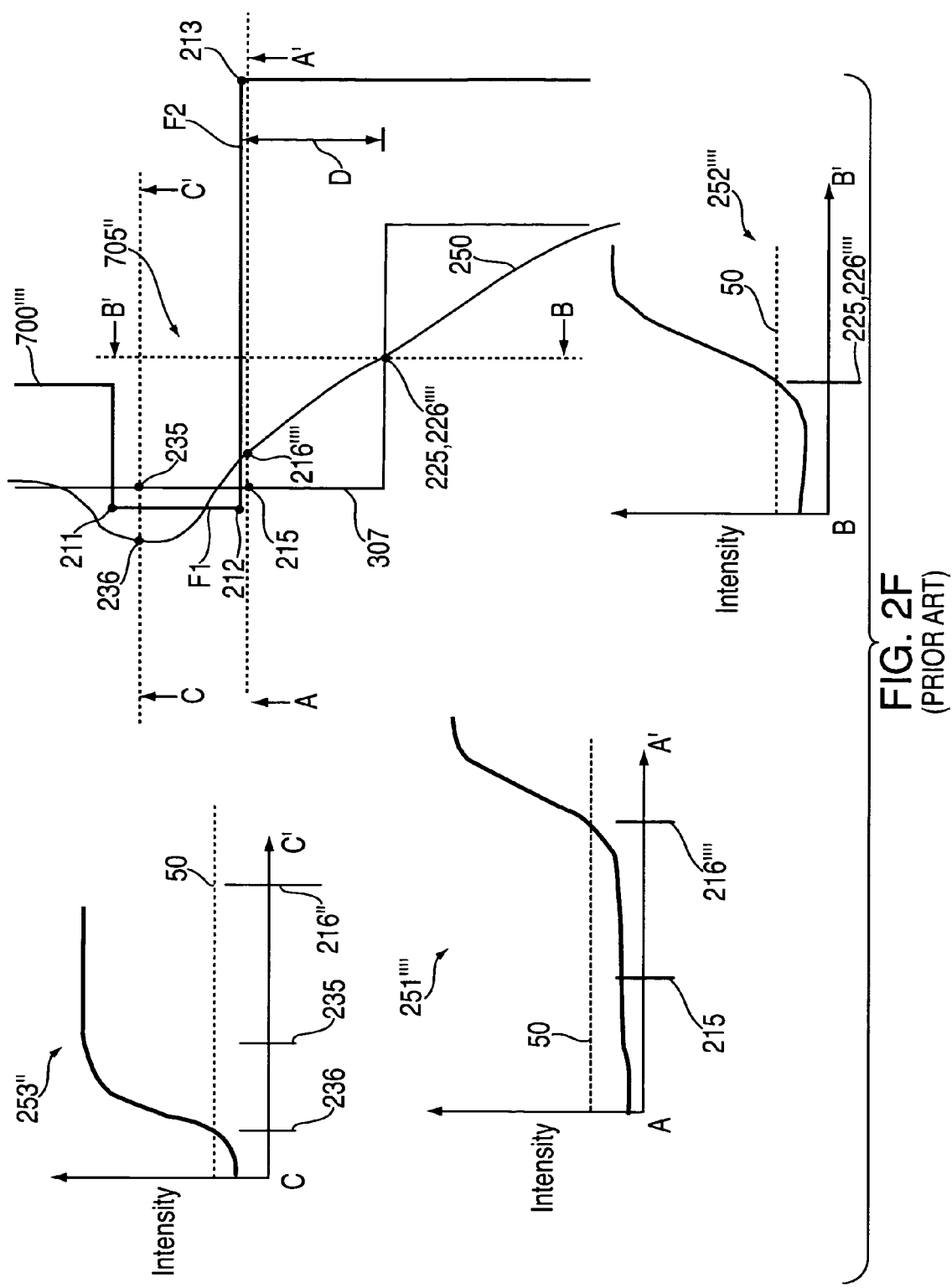

In the following description, numerous specific details may be set forth to provide a thorough understanding of the present invention. However, it will be obvious to those skilled in the art that the present invention may be practiced without such specific details.

Refer now to the drawings wherein depicted elements are not necessarily shown to scale and wherein like or similar elements are designated by the same reference numeral through the several views.

Figure 3:
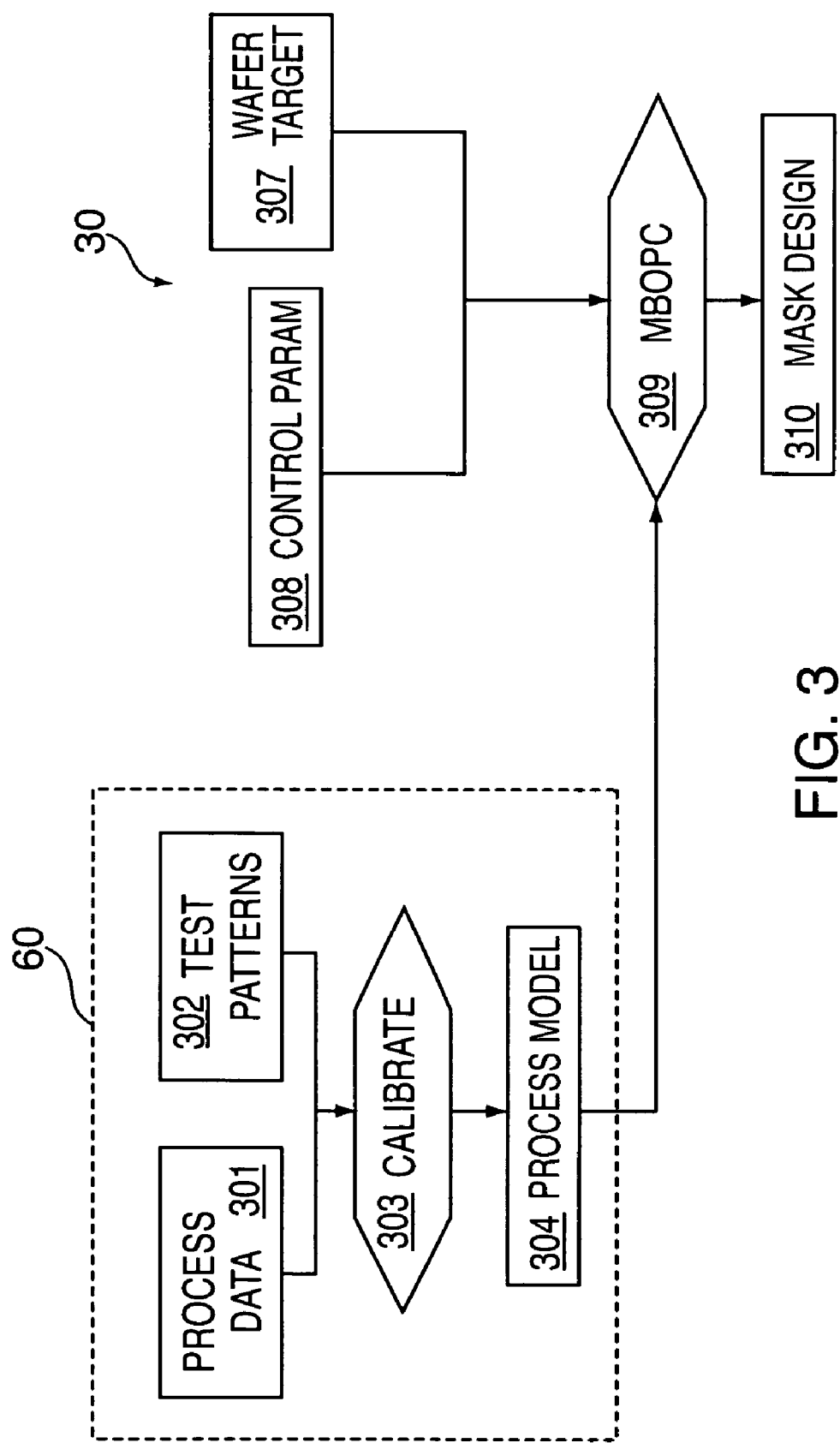
FIG. 3 illustrates a flow diagram of method steps of a conventional OPC algorithm.

Referring to FIG. 3, a flow diagram of a conventional model based optical proximity correction (MBOPC) process is illustrated. The MBOPC process consists of two major sections: the creation of a model, referred to as Model Build 60, including Blocks 301-304, and the use of that model to create a photomask design based on the design of the semiconductor integrated circuit to be formed on a wafer, referred to as Data Prep 30, including Blocks 307-310. The model build process 60 is generally carried out one time for each semiconductor printing process that is used in the overall semiconductor manufacturing process. On the other hand, the data prep process 30 is repeated on every semiconductor design that will be run through the semiconductor manufacturing process. In a typical semiconductor foundry business, there may be hundreds of different designs that will be run through the same data prep process.

Building OPC models (Model Build 60) is well known in the art and only an overview will be described here to aid in understanding the present invention. Model Build 60 typically requires that process data (Block 301) be collected that represents the manufacturing process that will be used to print patterns on the wafer. The process data collected is based on a set of test patterns (Block 302) that represent typical types of patterns that will exist in semiconductor designs that will be built using the manufacturing process. A process model describes the relationship between the process data and the test pattern designs that were used to create the process data. The model is calibrated (Block 303) by fitting this relationship to predetermined model forms. This can be accomplished using various numerical techniques. The result of the calibration step 303 is an OPC model, or process model (304), that provides a mathematical means to describe the changes introduced when an ideal photomask pattern is transferred onto a wafer through a printing process.

The data preparation step (Data Prep 30) of a MBOPC flow is also well known in the art. A desired target to be printed on the wafer 307 is provided as input. In a typical example, the initial wafer target 307 is derived from the design for a specific semiconductor chip or IC. The IC design is also typically used as a starting point for deriving the initial mask shape that will be corrected by the MBOPC process, and is also provided as input (Block 307). Generally, single layers of the design are processed individually and that is the process that is described in this example. It is understood that multiple layers could be processed simultaneously. A bias is typically applied to the design shapes on the wafer target so that the shape sizes will be equivalent to the final dimensions that are desired on the semiconductor wafer. This creates a wafer target layer (Block 307) that will be used by the MBOPC software as the desired result. For example, if a CD of 87 nm is specified in the IC design, and the desired target CD is 42 nm, then a bias of 45 nm may be applied to the IC design to form the wafer target layer 307 as input to the MBOPC.

Using the process model 304 created previously, the MBOPC software then determines corrections that will be applied to the initial mask design to ensure that the printed result approximates the wafer target (307). A set of control parameters (308) are used to control the movement of the mask edges and these control parameters also impact the corrections that are applied to the mask design. This correction step 309 is generally called model based optical proximity correction (MBOPC), although it is understood that many more effects, in addition to optical proximity effects, may typically be corrected through the MBOPC process. The end result of this is a mask design (310) that may or may not look similar to the IC design, but should result in a final wafer pattern that looks similar to the wafer target (307), at least in terms of the desired critical dimensions (CDs).

Figure 4:
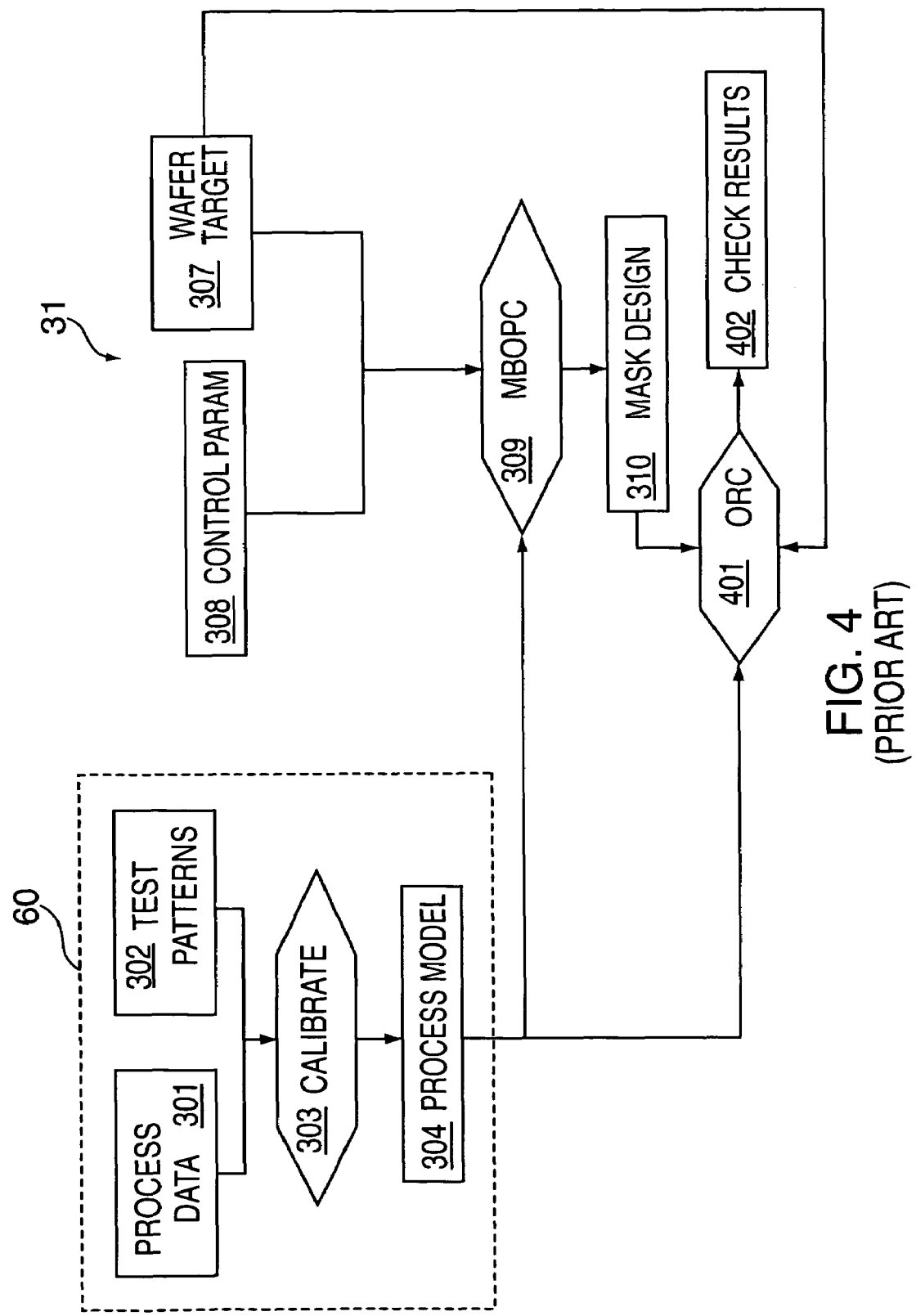
FIG. 4 illustrates a flow diagram of method steps of a conventional OPC algorithm including optical rule checking (ORC) of the mask design.

FIG. 4 is a straightforward extension of FIG. 3, showing the addition of a results checking step 401 that is performed on the final mask design 310. In this case, the model build process 60 (comprising Blocks 301-304) is the same as shown in FIG. 3. The Data Prep process 31 includes the same data prep process (Blocks 307-310) as in FIG. 3, and delivers the same final mask design 310 for each semiconductor IC layer design. However, in this example, Data Prep 31 includes the additional step of checking (Block 401) the mask design 310 to ensure that the design 310 resulting from the MBOPC was correct, within a set of design rules. This design check step (Block 401) is often called optical rules checking, or ORC, and entails applying the process model (304) to the mask design (310) and obtaining (e.g. simulating or computing) contours that represent the final wafer shapes that will be printed. As discussed above, the process model 304 may include the optical image, the resist image process as well as the etch process. These contours are then compared to the wafer target (307) and checked to make sure they satisfy various rules such as manufacturability rules. The results of these checks (402) are used to determine whether the MBOPC process was successful and whether the mask 310 should be built.

Figure 5:
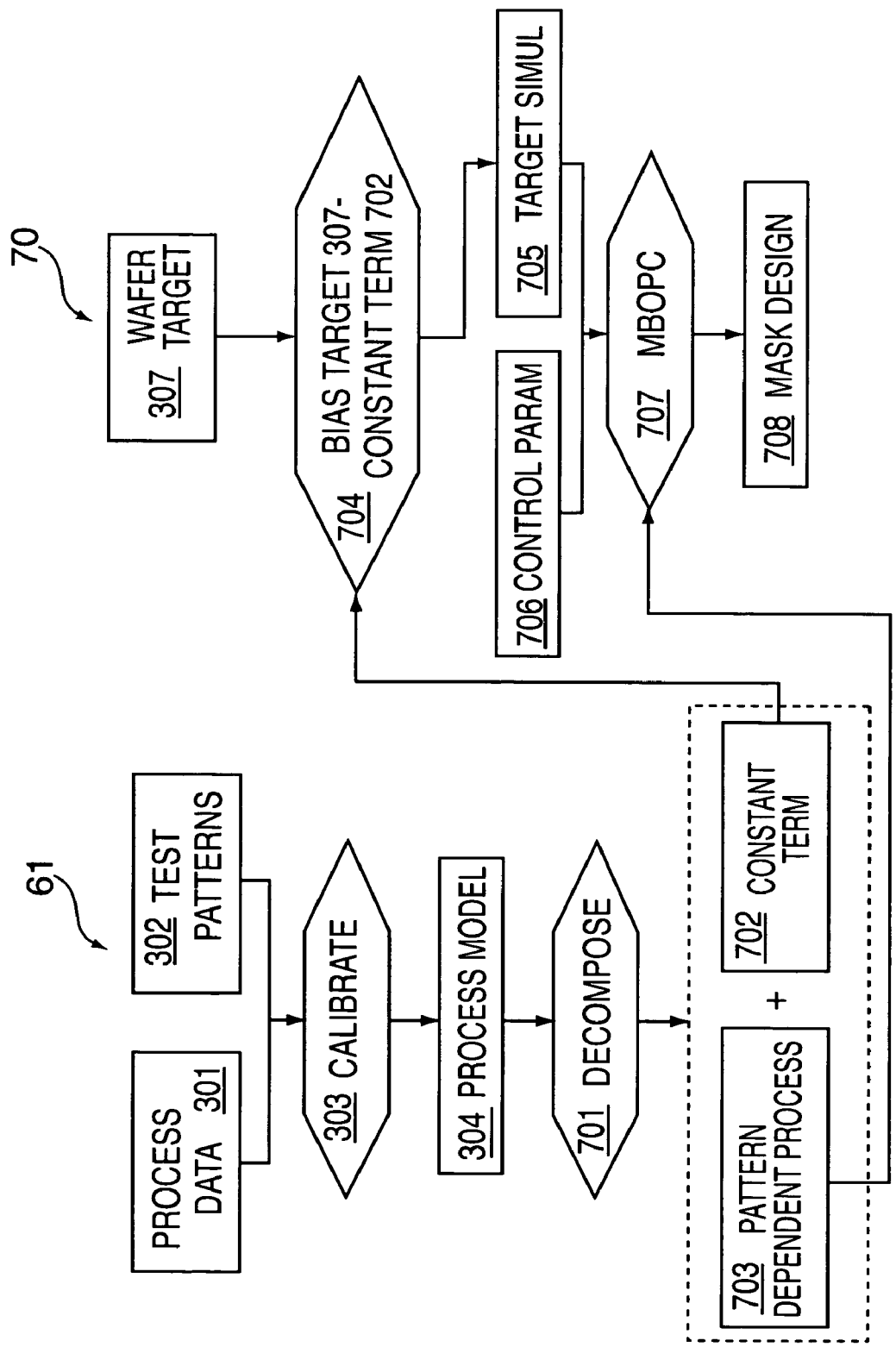
FIG. 5 illustrates a flow chart of an embodiment of an OPC process according to the present invention.

FIG. 5 is a flowchart representing the preferred embodiment of the invention. As in FIG. 3, the inventive MBOPC process is divided into 2 main sections: Model Build 61, comprising Blocks 301-304 and additional Blocks 701-703; and Data Prep 70, comprising Blocks 307 and 704-708. In accordance with the present invention, the process model is calibrated in a manner similar to the conventional Model Build process flow 60, to result in a process model 304. At this point, an additional step is taken to decompose the model (Block 701) into two components. The first model component is a constant term that 702 is independent of pattern type. Typically, this global bias term 702 has a negative value, meaning that the patterns are made globally smaller during the Data Prep section 70, to be discussed below. The second model component is a pattern dependent portion of the process model or component 703 (which may comprise one or more terms or functions) that describes the non-constant relationship between the mask patterns and the final wafer patterns. Together, the constant term (702) and the pattern dependent process model portion (703) add up to make the process model (304).

Figure 6:
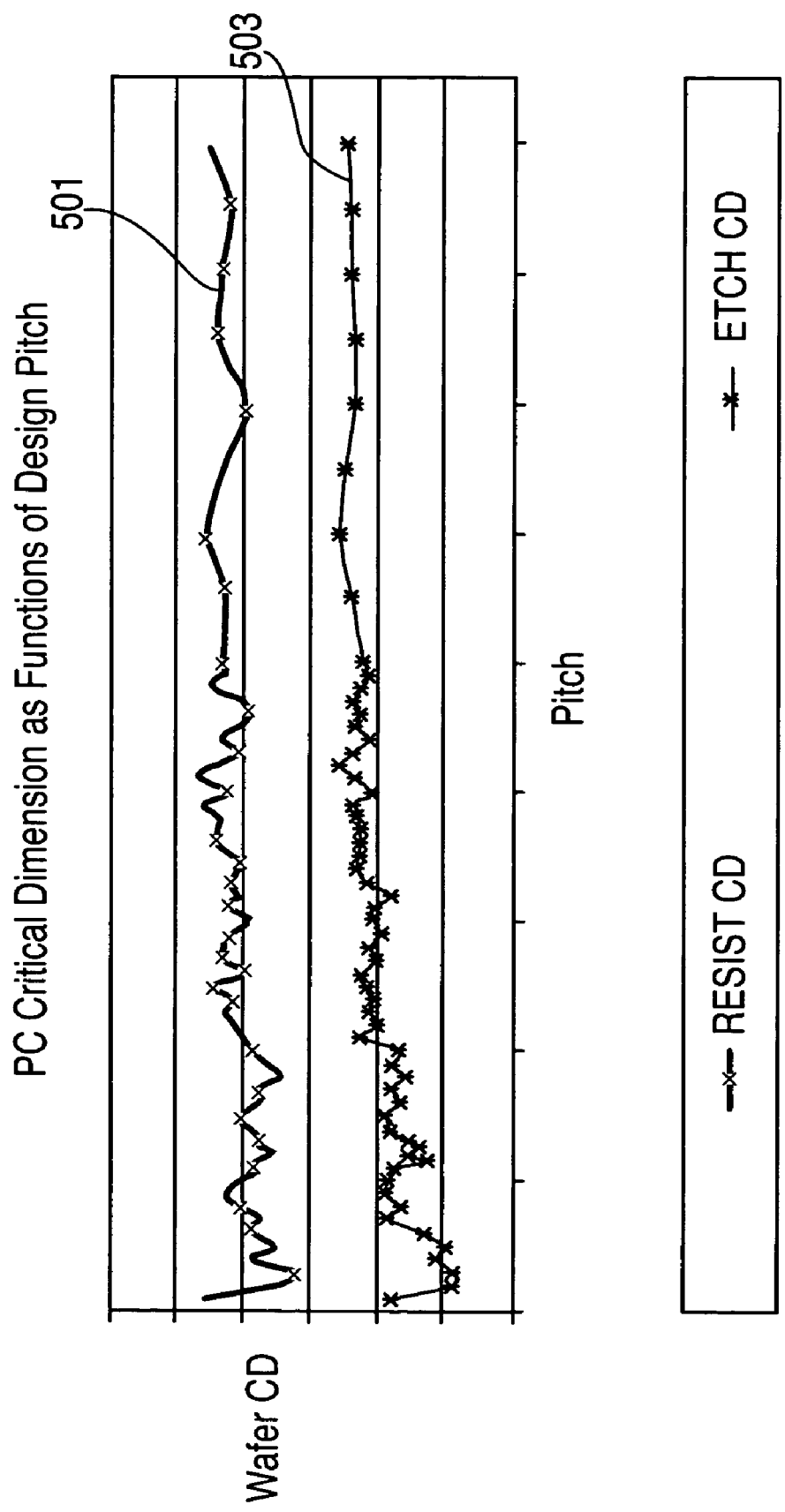
FIG. 6 illustrates typical variations in feature dimensions as a function of pattern spacing (pitch) across a wafer.

The decomposition (Block 701) of the process model 304 into constant term 702 and pattern dependent process model portion 703 is illustrated by reference to FIGS. 6 and 7. FIG. 6 is a plot of variations in critical dimension (CD) as a function of across-chip pattern variations, specifically over the range of pitches of various patterns in the IC layer. FIG. 6 illustrates an example of across-chip CD or line-width variation after development of the resist (curve 501) and after etch (curve 503). Both the after-develop CD curve 501 and the final CD (after etch) curve 503 show very similar behavior, suggesting that the etch process line-width variation 503 follows the line-width variation trend 501 introduced by the resist process.

Figure 7:
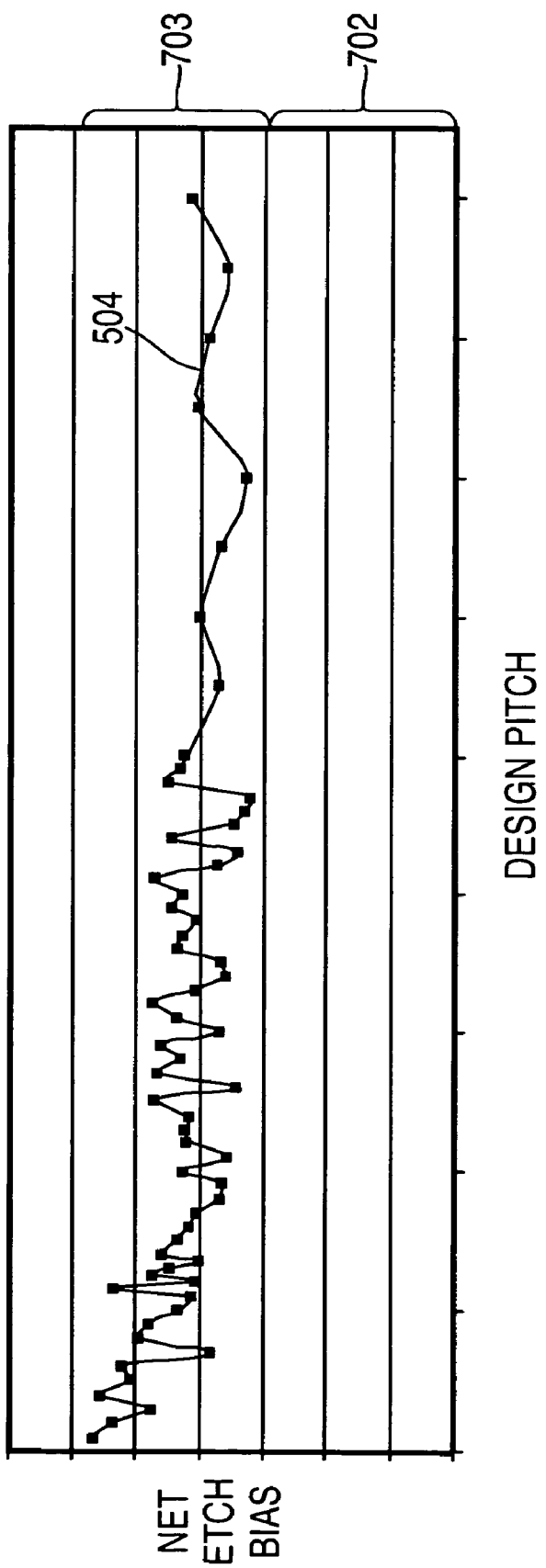
FIG. 7 illustrates a decomposition of variations in feature dimensions into a pattern dependent and constant terms.

FIG. 7 illustrates a plot of a net etch process variation 504 through pitch, illustrating how the etch process model 304 can be decomposed into a constant offset 702 plus a non-linear pattern-dependent component 703 during modeling, in accordance with the present invention.

Referring again to FIG. 5, the Data Prep 70 section of the preferred embodiment comprises a wafer target 307 and initial mask design (e.g. based on the chip or IC design) that is the input to this flow (similar to the prior flows of FIGS. 3 and 4) and this flow is repeated for all chip or IC designs that will be run through the specified manufacturing process. In accordance with the present invention, the formation of the inventive target layer 705 (Block 704) includes biasing the wafer target 307 with the constant term 702 to obtain a simulation wafer target 705 which will be used by the MBOPC algorithm to evaluate the results of the simulated wafer pattern resulting from the mask design, rather than comparing the simulated wafer pattern to the desired wafer target 307, as in the conventional method. The biasing of the wafer target 307 with the constant term 702 will typically result in shapes on the simulation wafer target 705 that are larger than the corresponding shapes on the desired wafer target 307 in the conventional process, as illustrated in FIG. 9A. In a similar manner to the prior art method, the mask layer (which initially is typically set equal to the design layer) is then modified by the MBOPC software in the MBOPC (Block 707) until the simulated wafer pattern (which could be any pattern such as an image or an etched pattern) matches the simulation target 705 within an acceptance criterion. In this case, however, only the pattern dependent component 703 of the process model 304 are used as the simulation process model in MBOPC and the control parameters 706 for the corrections are likely to be different than those used in the conventional flow. The output of the MBOPC step 707 is a corrected mask design 708 where the corrections applied may be different than those applied in the prior art process.

Figure 9C:
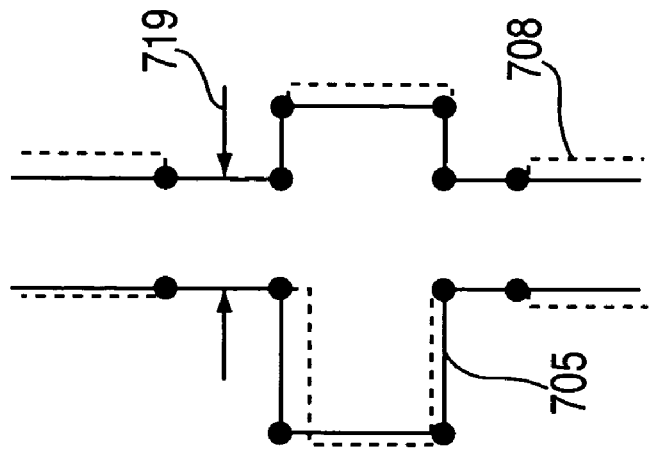
FIG. 9C illustrates a mask design resulting from OPC using a target adjusted in accordance with the invention.
Figure 9B:
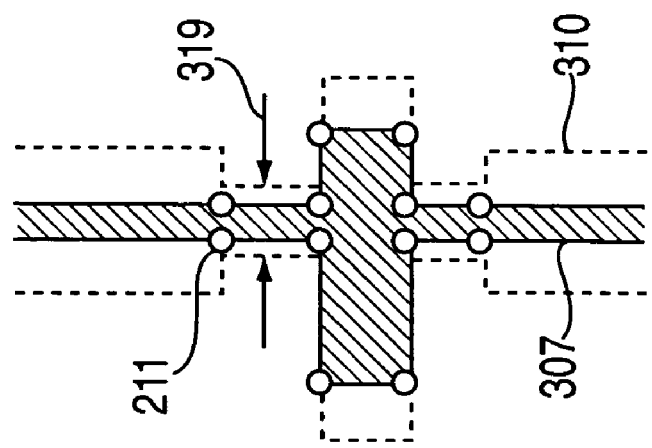
FIG. 9B illustrates a mask design resulting from OPC using a prior art adjusted target.
Figure 9A:
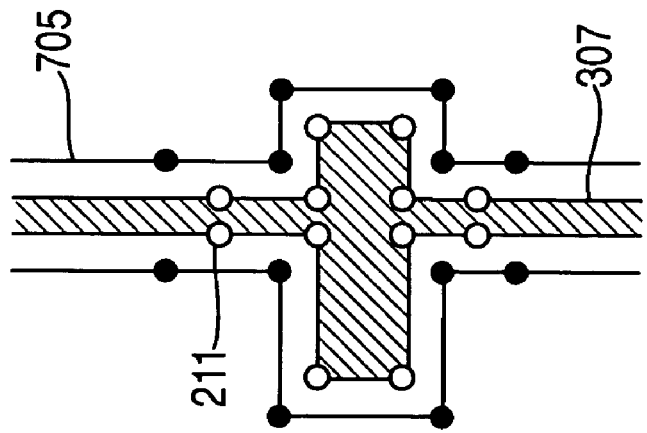
FIG. 9A illustrates a prior art adjusted target used for OPC overlain for comparison with an target adjusted in accordance with the present invention.

FIG. 9C illustrates the improvement in the final mask design 708 compared to the simulation target dimensions 705. In this case, the target dimensions 705 are larger than the final etch target by an amount equal to the constant bias 702. In this case, corners are less of a problem compared to prior art methods, since the simulation sites are placed closer to the final mask dimension. For example, referring to FIG. 9B, in a conventional MBOPC method, the resulting mask 310 may have a narrow notch of dimension 319. However, the final mask 708 has a contour, for example width 719 near the corner, that more closely conforms to the shape of the simulation target 705, as illustrated in FIG. 9C.

Figure 8:
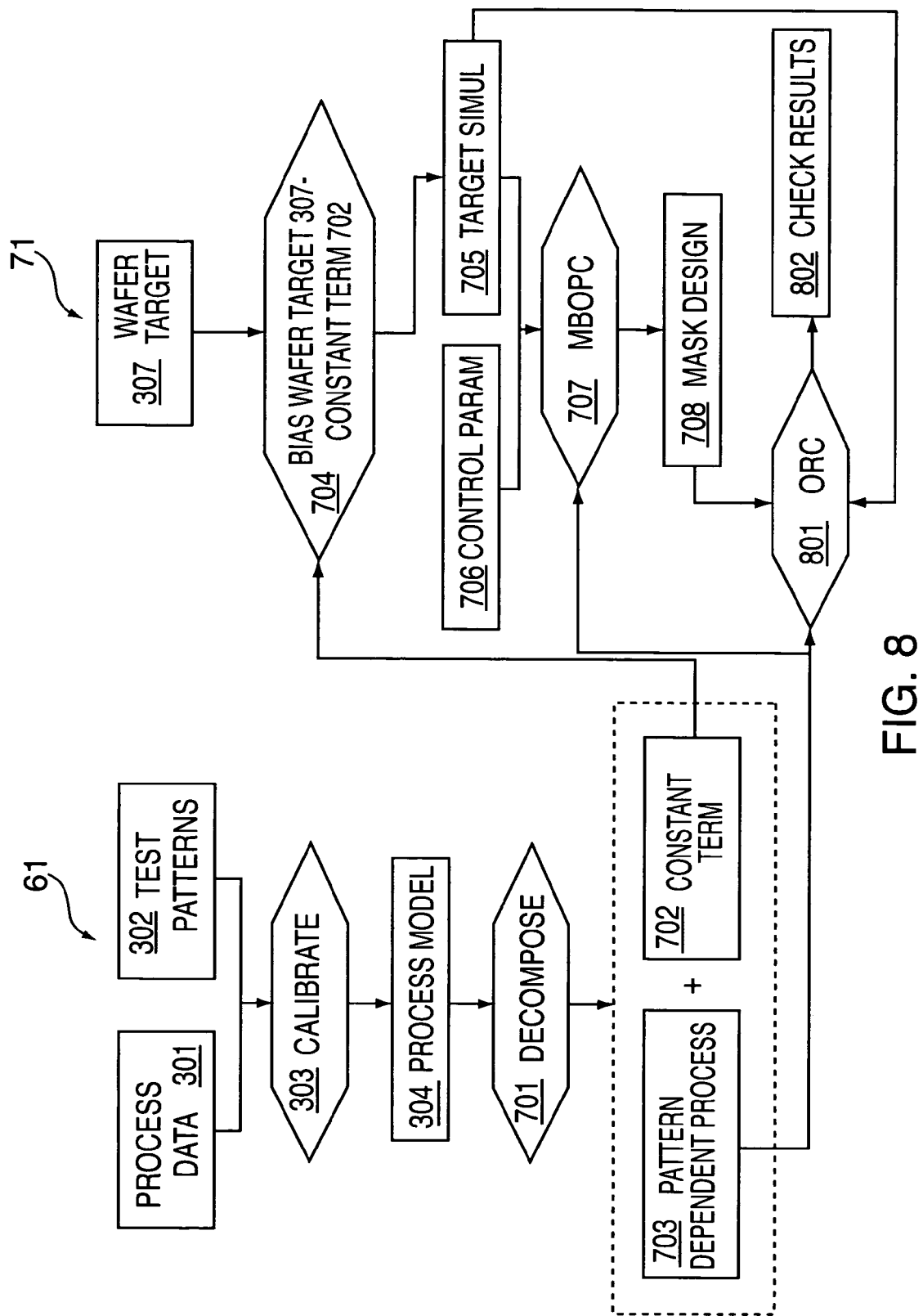
FIG. 8 illustrates a flow chart of an embodiment of an OPC process including ORC according to the present invention.

A second embodiment of the invention is shown in FIG. 8. This case is nearly identical with the embodiment illustrated in FIG. 5, except that a results checking step 801 is performed on the final mask design 708 in the Data Prep section 71. In a manner analogous to the addition of an ORC step into the standard OPC flow (see FIG. 4), the ORC step 801 has been included into the preferred embodiment of the invention. Here the ORC step 801 applies the pattern dependent component of the model 703 to the mask design 708. The resulting contours are compared to the simulation target 705 and checked to make sure they satisfy the design and manufacturability rules. Again, the results of these checks 802 are used to determine whether the MBOPC process was successful and whether the mask should be built.

Figure 10:
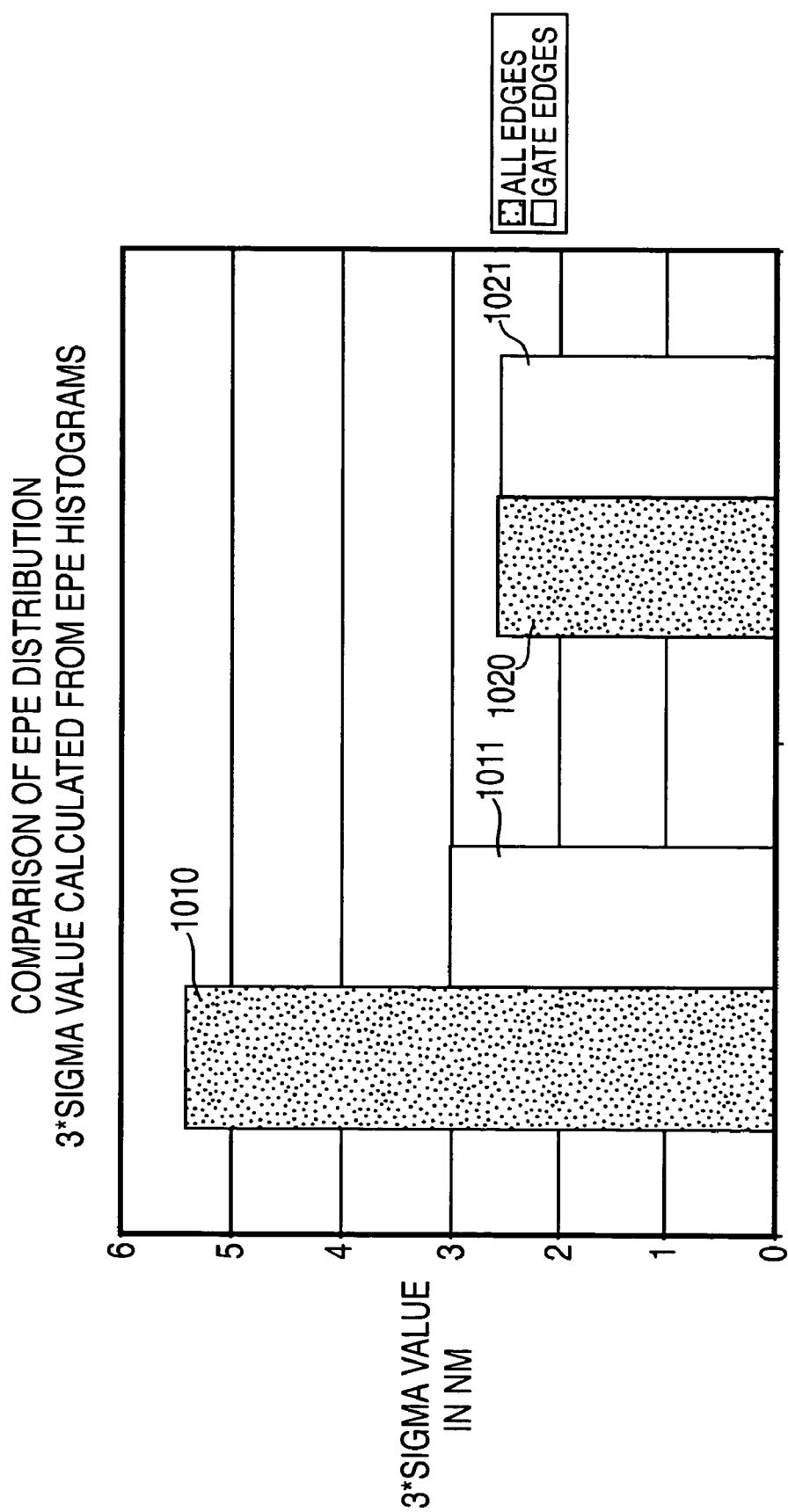
FIG. 10 plots edge placement error (EPE) distributions obtained using prior art OPC models compared to EPE distributions obtained when performing OPC according to the present invention.

FIG. 10 illustrates the improved across chip line-width variation (ACLV) obtained when MBOPC is performed in accordance with the present invention. The edge placement error distributions (EPE) at all edges 1010 and at gate edges 1011 for the prior art MBOPC were compared to EPE at all edges 1020 and at gate edges 1021 using MBOPC according to the present invention. The 3σ EPE distribution is improved for gate edges and all edges when the MBOPC of the present invention is used.

Figure 11:
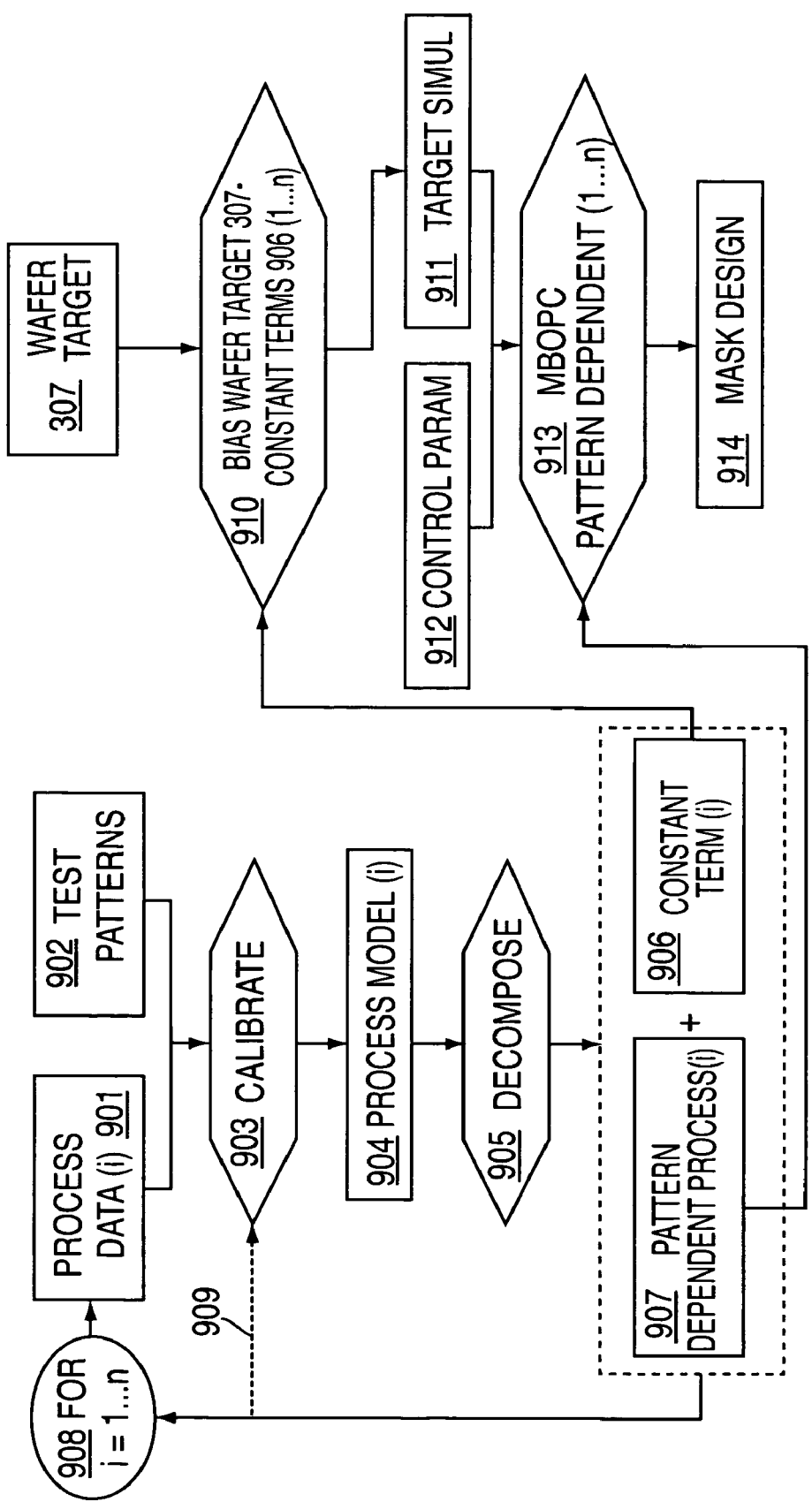
FIG. 11 illustrates a flow chart for an embodiment of the present invention using multiple process models.

Other embodiments of the present invention are possible. For example, referring to FIG. 11, multiple process steps may be accounted for by using separate process models or subprocesses. For example, the separate process models could include, but are not limited to, a mask process model, a lithographic image model, a resist model, an etch model, a chemical-mechanical polishing (CMP) process model or a combination thereof. In this case, a process model $904(i)$ for a given step i in the overall process is calibrated using process data $901(i)$ taken after that process step i has been completed. Using this data and the test pattern designs 902, the model $904(i)$ is calibrated (Block 903) resulting in a calibrated process model $904(i)$ for the given process step i. This process model $904(i)$ is then decomposed (Block 905) into a constant term $906(i)$ and a pattern dependent process model portion or component 907(*i*) for the process step i. This calibration procedure can be repeated (908) for each step i of n processes that need to be modeled. Here there are two slightly different methods that can be used, depending on the process being modeled and how the data is collected. The difference between these methods is represented by the dotted arrow (909) that flows into the calibration step 903 for a given process i that depends on the results of the decomposed process model 906(*i*−1), 907(*i*−1) of the previous process i−1. In the case where data for a given process can be collected completely independently from the other processes being modeled, then this arrow should not exist and each process model i can be built without knowledge of the previous process model i−1. However, the more typical situation is where a given process is dependent on a previous process step and the data collected for that process has also passed through the previous process step. In this case, the arrow (909) is required, as the calibration step for the current process i must use the previous step's model (i−1) in order to pre-process the test patterns (902) before calibrating for the current step i. For example, to model an etch process following a lithography process, the etch process should be modeled as the transformation of the post-lithography photoresist pattern to a final etched pattern. It should not be modeled as the transformation of a photomask pattern to a final etch pattern. So, the lithography process model must be known in order to build the etch model based on the etch data and the designed test patterns.

In this embodiment, the data prep flow is very similar to the data prep flow 70 of FIG. 5. The desired wafer target 307 is again biased (Block 910) to a simulation target 911 by the constant portions of the process model (906, i=1, . . . , n). In this case, the constant term 906 is now the sum of all of the individual constant terms for all of the process models i through n. The resulting simulation target (911) and the control parameters (912) are then input into the MBOPC step (913). This step will then apply the pattern dependent components 907(*i*), i=1, . . . , n of the various process models to create the corrected mask design 914. The MBOPC step 913 may apply the models in various ways, but the most common method would be to apply each model in succession to the design data. The order of the succession would match the order of the process steps that are being modeled.

It is recognized that because of the sequential processing of the models, that the pattern dependent portion 907(*i*) of a given process model 904(*i*) will operate on the combination of the pattern dependent component and constant term of the previous model (i−1). For example, when modeling a lithography process, the lithographically patterned dimension of a feature may be represented as D'=PL(D)+CL, where D' is the post-lithography dimension of the feature, D is the pre-lithography (mask) dimension of the feature, PL is the pattern dependent lithography model portion and CL is the constant term of the lithography model. If the lithography process is then followed by an etch process, the post-etch dimension for the same pattern will be given by D"=PE(D')+CE, where D" is the post-etch dimension, D' the post-lithography dimension, PE is the pattern dependent etch model and CE is the constant term of the etch model. So, the final dimension can be found from the mask dimension using D"=PE(PL(D)+CL)+CE, which indicates that the pattern dependent etch model is applied to the true post-lithography pattern, not just the pattern dependent process model component.

Although the present invention and its advantages have been described in detail, it should be understood that various changes, substitutions and alterations can be made herein without departing from the spirit and scope of the invention as defined by the appended claims.

What is claimed is:

1. A method of designing a mask for forming a pattern on a wafer, the method comprising the steps of:
   providing a process model describing a process for transferring a mask pattern to a wafer pattern;
   decomposing said process model into a pattern dependent process model and a constant term;
   providing a desired wafer target pattern;
   biasing said desired wafer target pattern with said constant term to form a simulation target pattern;
   providing an initial mask design; and
   modifying said initial mask design to form a final mask design, so that when said final mask design is simulated using said pattern dependent process model, a simulated wafer pattern is obtained that matches said simulation target pattern within an acceptance criterion.

2. The method of claim 1 wherein said process model comprises a mask process model, a lithographic image model, a resist model, an etch model, a CMP process model or a combination thereof.

3. The method of claim 1 further comprising checking said final mask design in accordance with a set of design rules.

4. The method of claim 1 wherein said providing said process model comprises:
   providing a test mask design;
   forming a wafer test pattern in accordance with said test mask design;
   collecting data regarding said forming and said wafer test pattern; and
   calibrating said process model in accordance with said data.

5. The method of claim 4 wherein said process further comprises a plurality of subprocesses, and wherein said steps of forming a wafer test pattern, collecting data and calibrating said process model are performed for each of said subprocesses.

6. The method of claim 5 wherein said data of each of said subprocesses are independent of said other subprocesses.

7. The method of claim 5 wherein said steps of forming a wafer test pattern, collecting data and calibrating said process model are performed sequentially for each of said subprocesses, and wherein said step of calibrating at least one of said subprocesses model is dependent on the subprocess model of a prior subprocess.

8. The method of claim 1 further comprising forming a pattern on a wafer using said process, wherein said process comprises using said final mask design.

9. The method of claim 1 wherein said initial mask design is derived from said desired wafer target pattern.

10. The method of claim 1 wherein said modifying said initial mask comprises model-based optical proximity correction.

11. The method of claim 1 wherein said process further comprises a plurality of subprocesses.

12. A program storage device readable by a machine, tangibly embodying a program of instructions executable by the machine to perform method steps for designing a mask for transferring a mask pattern to a wafer pattern, the method comprising the steps of:
   providing a process model describing a process for transferring a mask pattern to a wafer pattern;
   decomposing said process model into a pattern dependent process model and a constant term;
   providing a desired wafer target pattern;

biasing said desired wafer target pattern with said constant term to form a simulation target pattern;
providing an initial mask design; and
modifying said initial mask design to form a final mask design, so that when said final mask is simulated using said pattern dependent process model, a simulated wafer pattern is obtained that matches said target design within an acceptance criterion.

13. The program storage device of claim 12 wherein said process model comprises a mask process model, a lithographic image model, a resist model, an etch model, a CMP process model or a combination thereof.

14. The program storage device of claim 12 further comprising checking said final mask design in accordance with a set of design rules.

15. The program storage device of claim 12 wherein said providing said process model comprises:
providing a test mask design;
collecting data regarding forming a wafer test pattern in accordance with said test mask design and collecting data regarding said wafer test pattern; and
calibrating said process model in accordance with said data.

16. The program storage device of claim 15 wherein said process further comprises a plurality of subprocesses, and wherein said steps of collecting data and calibrating said process model are performed for each of said subprocesses.

17. The program storage device of claim 16 wherein said data of each of said subprocesses are independent of said other subprocesses.

18. The program storage device of claim 16 wherein said steps of collecting data and calibrating said process model are performed sequentially for each of said subprocesses, and wherein said step of calibrating at least one of said subprocesses model is dependent of the subprocess model of a prior subprocesses.

19. The program storage device of claim 12 wherein said initial mask design is derived from said desired wafer target pattern.

20. The program storage device of claim 12 wherein said modifying said initial mask design comprises model-based optical proximity correction.

21. The program storage device of claim 12 wherein said process further comprises a plurality of subprocesses.

22. A computer program product comprising a computer usable medium having computer readable program code means embodied therein for designing a mask for forming a pattern on a wafer, the computer readable program code means in said computer program product comprising:
computer readable program code means for causing a computer to provide a process model describing a process for transferring a mask pattern to a wafer pattern;
computer readable program code means for causing a computer to decompose said process model into a pattern dependent process model and a constant term;
computer readable program code means for causing a computer to provide a desired wafer target pattern;
computer readable program code means for causing a computer to bias said integrated circuit design with said constant term to form a simulated target pattern;
computer readable program code means for causing a computer to provide an initial mask design; and
computer readable program code means for causing a computer to modify said initial mask design to form a final mask design, so that when said final mask is simulated using said pattern dependent process model, a simulated wafer pattern is obtained that matches said target design within an acceptance criterion.

23. The computer program product of claim 22 wherein said process model comprises a mask process model, a lithographic image model, a resist model, an etch model, a CMP process model or a combination thereof.

24. The computer program product of claim 22 further comprising computer readable program code means for causing a computer to check said final mask design in accordance with a set of design rules.

25. The computer program product of claim 22 wherein said computer readable program code means for causing a computer to provide said process model further comprises:
computer readable program code means for causing a computer to provide a test mask design;
computer readable program code means for causing a computer to collect data regarding said forming a wafer test pattern in accordance with said test mask design and to collect data regarding said wafer test pattern; and
computer readable program code means for causing a computer to calibrate said process model in accordance with said data.

26. The computer program product of claim 25 wherein said process further comprises a plurality of subprocesses, and wherein said computer program product further comprises computer readable program code means for causing a computer to collect data regarding forming a wafer test pattern in accordance with said test mask design and to collect data regarding said wafer test pattern and computer readable program code means for causing a computer to calibrate said process model in accordance with said data for each of said subprocesses.

27. The computer program product of claim 26 wherein said data of each of said subprocesses are independent of said other subprocesses.

28. The computer program product of claim 26 wherein said computer readable program code means for causing a computer to collect data regarding said forming a wafer test pattern in accordance with said test mask design and to collect data regarding said wafer test pattern and for causing a computer to calibrate said process model in accordance with said data are performed sequentially for each of said subprocesses, and wherein said computer readable program code means for causing a computer to calibrate at least one of said subprocesses model is dependent on the subprocess model of a prior subprocesses.

29. The computer program product of claim 22 wherein said initial mask design is derived from said desired wafer target pattern.

30. The computer program product of claim 22 wherein said computer readable program code means for causing a computer to modify said initial mask design comprises model-based optical proximity correction.

31. The computer program product of claim 22 wherein said process further comprises a plurality of subprocesses.

* * * * *